United States Patent
Zhao

(10) Patent No.: US 12,120,939 B2
(45) Date of Patent: Oct. 15, 2024

(54) COVER PLATE AND DISPLAY DEVICE

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventor: Chen Zhao, Hubei (CN)

(73) Assignees: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 486 days.

(21) Appl. No.: 17/593,912

(22) PCT Filed: Jun. 9, 2021

(86) PCT No.: PCT/CN2021/099126
§ 371 (c)(1),
(2) Date: Sep. 28, 2021

(87) PCT Pub. No.: WO2022/252269
PCT Pub. Date: Dec. 8, 2022

(65) Prior Publication Data
US 2023/0255091 A1  Aug. 10, 2023

(30) Foreign Application Priority Data
Jun. 3, 2021  (CN) .................. 202110617224.7

(51) Int. Cl.
*H10K 59/80* (2023.01)
*H10K 102/00* (2023.01)

(52) U.S. Cl.
CPC ..... *H10K 59/879* (2023.02); *H10K 2102/311* (2023.02)

(58) Field of Classification Search
CPC . H10K 59/873–879; H10K 50/85–858; H10K 2102/311; H10K 77/00–111; H01L 33/58; G09G 2380/02
See application file for complete search history.

(56) References Cited

U.S. PATENT DOCUMENTS

2015/0144918 A1   5/2015  Cho et al.
2020/0201033 A1*  6/2020  Song ................. G02B 27/0025

FOREIGN PATENT DOCUMENTS

CN   104241541 A   12/2014
CN   105185813 A   12/2015
(Continued)

*Primary Examiner* — Mohammad A Rahman
*Assistant Examiner* — Eric Manuel Mulero Flores

(57) ABSTRACT

A cover plate and a display device is provided. The cover plate includes a first cover plate layer and a second cover plate layer. The first cover plate layer is located on a light entry side of the cover plate. The second cover plate layer is located on a light exit side of the cover plate and attached to a first surface of the first cover plate layer. A plurality of protrusions are disposed on the first surface of the first cover plate layer. A refractive index of the first cover plate layer is less than a refractive index of the second cover plate layer.

18 Claims, 2 Drawing Sheets

(56) References Cited

FOREIGN PATENT DOCUMENTS

| | | |
|---|---|---|
| CN | 208173633 U | 11/2018 |
| CN | 209785979 U | 12/2019 |
| CN | 110854177 A | 2/2020 |
| CN | 111834544 A | 10/2020 |
| CN | 212085044 U | 12/2020 |
| CN | 112885979 A | 6/2021 |

\* cited by examiner

COVER PLATE AND DISPLAY DEVICE

FIELD OF INVENTION

This application relates to the field of display technologies, and in particular, to a cover plate and a display device.

RELATED ART

With the development of display technologies, increasing high requirements are imposed for colors and portability. An organic light emitting diode (OLED) display panel gradually enters electronics consumer markets such as a mobile device market and a television market by virtue of characteristics such as high light emitting efficiency, a wide viewing angle, a high response speed, an ultra-thin thickness, a light weight, and a possibility to be manufactured on a flexible substrate.

In the conventional art, transparent glass is usually utilized as a cover plate of the OLED display panel. A refractive index of the glass generally ranges from 1.4 to 1.5, and a refractive index of an organic light emitting layer of the OLED display panel generally ranges from 1.7 to 1.8. According to a principle of total reflection, when light emitted from the organic light emitting layer after power-on passes through the glass to enter the air, most of the light returns to the organic light emitting layer, resulting in a great reduction in light exiting efficiency of a whole display device. Thus, improving the light exiting efficiency of the display device becomes a research and development focus of technicians.

SUMMARY OF INVENTION

Technical Problem

This application provides a cover plate to resolve a problem as follows: since a cover plate in the related art uses glass having a refractive index less than a refractive index of an organic light emitting layer, according to a principle of total reflection, most of light emitted from the organic light emitting layer returns to the organic light emitting layer, resulting in low light exiting efficiency of a display device.

Technical Solution

An embodiment of this application provides a cover plate. The cover plate includes a first cover plate layer and a second cover plate layer. The first cover plate layer is located on a light entry side of the cover plate. The second cover plate layer is located on a light exit side of the cover plate and attached to a first surface of the first cover plate layer. A plurality of protrusions are disposed on the first surface of the first cover plate layer. A refractive index of the first cover plate layer is less than a refractive index of the second cover plate layer.

In the cover plate provided in this embodiment of this application, a cross-sectional width of each of the protrusions is greater than or equal to 10 μm and less than or equal to 30 μm.

In the cover plate provided in this embodiment of this application, the cover plate comprises a bending area and a non-bending area, and the cross-sectional width of the protrusion located in the bending area is greater than the cross-sectional width of the protrusion located in the non-bending area.

In the cover plate provided in this embodiment of this application, the cross-sectional widths of the protrusions decrement from the bending area to the non-bending area.

In the cover plate provided in this embodiment of this application, a thickness of the first cover plate layer or the second cover plate layer is greater than or equal to 30 μm and less than or equal to 70 μm.

In the cover plate provided in this embodiment of this application, a height of each of the protrusions is greater than or equal to one third of the thickness of the second cover plate layer and less than or equal to two thirds of the thickness of the second cover plate layer.

In the cover plate provided in this embodiment of this application, a cross-sectional shape of each of the protrusions is semicircular, semielliptical, triangular, or rectangular.

In the cover plate provided in this embodiment of this application, the first cover plate layer comprises ultra-thin glass, and the second cover plate layer comprises any one of titanium dioxide, tantalum pentoxide, or hafnium oxide.

In the cover plate provided in this embodiment of this application, the second cover plate layer comprises transparent polyimide, and the first cover plate layer comprises alumina oxide or silicon dioxide.

In the cover plate provided in this embodiment of this application, the refractive index of the second cover plate layer is greater than or equal to 1.5.

An embodiment of this application further provides a display device. The display device includes a flexible display panel and a cover plate disposed on the flexible display panel. The cover plate includes a first cover plate layer and a second cover plate layer. The first cover plate layer is located on a light entry side of the cover plate. The second cover plate layer is located on a light exit side of the cover plate and attached to a first surface of the first cover plate layer. A plurality of protrusions are disposed on the first surface of the first cover plate layer. A refractive index of the first cover plate layer is less than a refractive index of the second cover plate layer.

In the display device provided in this embodiment of this application, a cross-sectional width of each of the protrusions is greater than or equal to 10 μm and less than or equal to 30 μm.

In the display device provided in this embodiment of this application, the cover plate comprises a bending area and a non-bending area, and the cross-sectional width of the protrusion located in the bending area is greater than the cross-sectional width of the protrusion located in the non-bending area.

In the display device provided in this embodiment of this application, the cross-sectional widths of the protrusions decrement from the bending area to the non-bending area.

In the display device provided in this embodiment of this application, a thickness of the first cover plate layer or the second cover plate layer is greater than or equal to 30 μm and less than or equal to 70 μm.

In the display device provided in this embodiment of this application, a height of each of the protrusions is greater than or equal to one third of the thickness of the second cover plate layer and less than or equal to two thirds of the thickness of the second cover plate layer.

In the display device provided in this embodiment of this application, a cross-sectional shape of each of the protrusions is semicircular, semielliptical, triangular, or rectangular.

In the display device provided in this embodiment of this application, the first cover plate layer is made of ultra-thin glass, and the second cover plate layer is made of any one of titanium dioxide, tantalum pentoxide, or hafnium oxide.

In the display device provided in this embodiment of this application, the second cover plate layer is made of transparent polyimide, and the first cover plate layer is made of alumina oxide or silicon dioxide.

In the display device provided in this embodiment of this application, the refractive index of the second cover plate layer is greater than or equal to 1.5.

Beneficial Effects

This application provides a cover plate. The cover plate includes a first cover plate layer and a second cover plate layer. The first cover plate layer is located on a light entry side of the cover plate. The second cover plate layer is located on a light exit side of the cover plate and attached to a first surface of the first cover plate layer. A plurality of protrusions is disposed on the first surface of the first cover plate layer. A refractive index of the first cover plate layer is less than a refractive index of the second cover plate layer. According to this application, a plurality of protrusions is disposed on the first surface of the first cover plate layer, the second cover plate layer is attached to the first surface of the first cover plate layer, and the refractive index of the first cover plate layer is less than the refractive index of the second cover plate layer, so that light emitted by an organic light emitting layer of an OLED display panel is transmitted from a film layer having a low refractive index to a film layer having a high refractive index, thereby reducing light loss caused by total reflection. The disposed plurality of protrusions forms a microlens array for converging the light at the light exit side of the cover plate, so that light exiting efficiency of the whole display device is increased.

DETAILED DESCRIPTION OF PREFERRED EMBODIMENTS

To make the objectives, technical solutions and effects of this application clearer and more comprehensible, this application is further described below in detail with reference to the accompanying drawings and embodiments. In the accompanying drawings, for clarity and ease of understanding and description, sizes and thicknesses of the components shown in the accompanying drawings are not drawn to scale.

Figure 1:
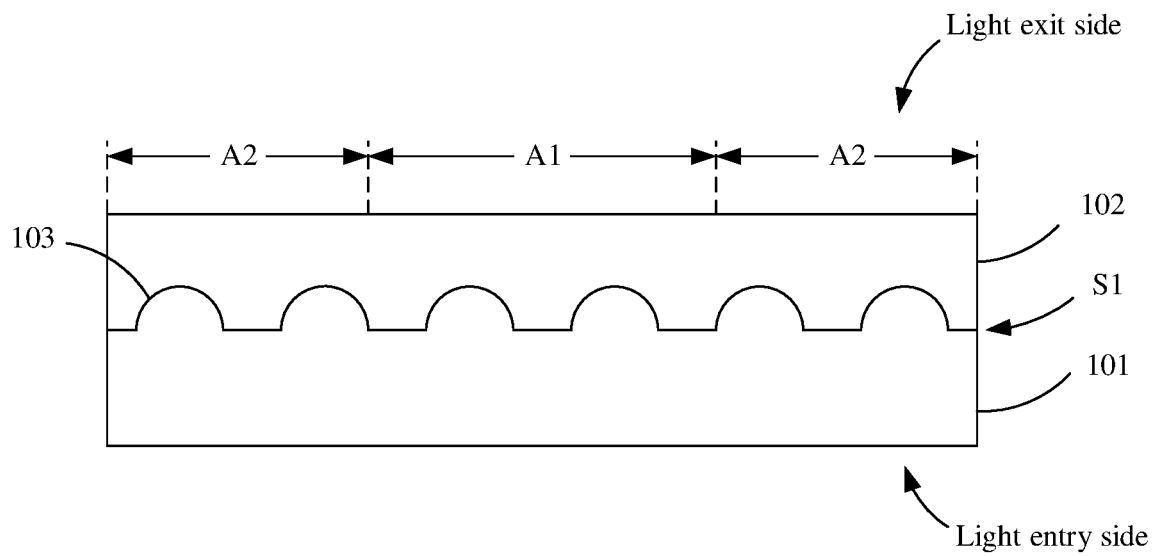
FIG. 1 is a basic schematic structural diagram of a cover plate according to an embodiment of this application.

FIG. 1 is a basic schematic structural diagram of a cover plate according to an embodiment of this application. A cover plate 10 includes a first cover plate layer 101 and a second cover plate layer 102. The first cover plate layer 101 is located on a light entry side of the cover plate 10. The second cover plate layer 102 is located on a light exit side of the cover plate 10 and attached to a first surface S1 of the first cover plate layer 101. A plurality of protrusions 103 are disposed on the first surface S1 of the first cover plate layer 101. A refractive index of the first cover plate layer 101 is less than a refractive index of the second cover plate layer 102.

It should be noted that, the light entry side of the cover plate 10 means a side where an OLED display panel (not shown in the figure) is placed, and the light exit side of the cover plate 10 means a side away from the OLED display panel. That the second cover plate layer 102 is attached to the first surface S1 of the first cover plate layer 101 means that the second cover plate layer 102 completely covers the plurality of protrusions 103 on the first surface S1 of the first cover plate layer 101.

It can be understood that, according to this application, a plurality of protrusions 103 are disposed on the first surface S1 of the first cover plate layer 101, the second cover plate layer 102 is attached to the first surface S1 of the first cover plate layer 101, and the refractive index of the first cover plate layer 101 is less than the refractive index of the second cover plate layer 102, so that light emitted by an organic light emitting layer of the OLED display panel is transmitted from a film layer having a low refractive index (that is, the first cover plate layer 101, and is an optically thinner medium) to a film layer having a high refractive index (that is, the second cover plate layer 102, and is an optically denser medium), thereby reducing light loss caused by total reflection. The disposed plurality of protrusions 103 forms a microlens array for converging the light at the light exit side of the cover plate 10, so that light exiting efficiency of the whole display device is increased.

In an embodiment, a cross-sectional width of each of the protrusions 103 is greater than or equal to 10 µm and less than or equal to 30 µm, and a cross-sectional shape of the each protrusion 103 is semicircular, semielliptical, triangular, or rectangular. A thickness of the first cover plate layer 101 or the second cover plate layer 102 is greater than or equal to 30 µm and less than or equal to 70 µm. A height of the each protrusion 103 is greater than or equal to one third of the thickness of the second cover plate layer 102 and less than or equal to two thirds of the thickness of the second cover plate layer 102.

In an embodiment, the first cover plate layer 101 is made of ultra-thin glass or transparent polyimide. Specifically, the transparent polyimide has a desirable bending property but an undesirable optical property, and requires a hard film to be coated thereon to enhance a surface rigidness in a limited way. In this case, folds are likely to appear, and scratch resistance is undesirable. When pressed or scratched by a hard object, the surface of the cover plate is easily scratched or even prone to a defective pixel. Compared with the transparent polyimide, the ultra-thin glass has a desirable optical property, a high surface rigidity, and excellent resilience, and is independent of material fatigue of materials like plastic. In other words, the ultra-thin glass is free of folds regardless of a bending degree. However, the ultra-thin glass has poor impact resistance, and therefore is easily broken by severe impact. In this case, not only damage and costs, but also prevention of glass debris from splashing should be considered. In this embodiment, a second cover plate layer 102 is further disposed on the first cover plate layer 101, to resolve splashing of glass debris when the ultra-thin glass is broken by severe impact. The first cover plate layer 101 in this embodiment uses the ultra-thin glass, and therefore has a desirable optical property, a high surface rigidness, and excellent resilience, and is free of splashing of debris generated by severe impact.

In should be noted that, in this embodiment, the plurality of protrusions 103 is formed by patterning the first surface S1 of the first cover plate layer 101. Then the second cover plate layer 102 is prepared on the first surface S1 of the first cover plate layer 101. The second cover plate layer 102 completely covers the plurality of protrusions 103. In this embodiment, the second cover plate layer 102 is made of a material having a high refractive index. The refractive index of the second cover plate layer 102 is greater than 1.5.

Specifically, in this embodiment, a method for preparing the cover plate 10 includes the following. First, a raw material (having a thickness between 100 μm and 500 μm) of the first cover plate layer 101 is thinned, where a thickness after the thinning is generally between 30 μm and 70 μm. Then the first surface S1 of the first cover plate layer 101 is patterned by using a yellow light process or a laser process, to form a plurality of protrusions 103, where a cross-sectional width of each of the protrusions 103 is between 10 μm and 30 μm. Next, a strengthening process is performed to improve a surface strength and a bending property of the first cover plate layer 101. Finally, a material having a high refractive index (the second cover plate layer 102) is prepared on the first surface S1 of the first cover plate layer 101, to obtain the cover plate 10. During module attachment of the cover plate 10, a side opposite to the side of the first cover plate layer 101 including the protrusions 103 (that is, the side opposite to the first surface S1) is attached to the light exit side of the OLED display panel.

It can be understood that, the plurality of protrusions 103 formed on the first surface S1 of the first cover plate layer 101 is capable of converging light. Specifically, the protrusions 103 protrudes toward the light exit side of the cover plate 10. The light emitted from the organic light emitting layer of the OLED display panel is transmitted from the first cover plate layer 101 to the second cover plate layer 102. When the light passes through the plurality of protrusions 103, the plurality of protrusions 103 can function as a microlens array to converge the light. In this way, light exiting efficiency of the cover plate 10 is enhanced, that is, the light exiting efficiency of the display device is enhanced.

In addition, the light emitted from the organic light emitting layer of the OLED display panel passes through the first cover plate layer 101 and then the second cover plate layer 102. Since the second cover plate layer 102 is made of the material having a high refractive index, the second cover plate layer has a desirable scattering effect. In this way, light exiting from a side of the display device can be effectively reduced, and the light exiting efficiency of the display device can be further enhanced.

In an embodiment, the material having a high refractive index includes titanium dioxide ($TiO_2$), tantalum pentoxide ($Ta_2O_5$), or hafnium oxide ($HfO_2$).

In an embodiment, the second cover plate layer 102 is made of ultra-thin glass or transparent polyimide. Specifically, the ultra-thin glass has a desirable optical property, a high surface rigidity, and excellent resilience, and is independent of material fatigue of materials like plastic. In other words, the ultra-thin glass is free of folds regardless of a bending degree. However, the ultra-thin glass has poor impact resistance, and therefore is easily broken by severe impact. In this case, not only damage and costs, but also prevention of glass debris from splashing should be considered. As a result, the ultra-thin glass cannot be used as an outer surface of the cover plate 10. Compared with the ultra-thin glass, the transparent polyimide is free of breakage and has a desirable bending property. The second cover plate layer 102 in this embodiment uses the transparent polyimide, and therefore not only has a desirable bending property, but is also unlikely to be broken.

It should be noted that, in this embodiment, the side of the second cover plate layer 102 attached to the first cover plate layer 101 is patterned to form a plurality of grooves respectively corresponding to (that is, identical in shape, size, and position) the plurality of protrusions 103. Then the first cover plate layer 101 is prepared on the side of the second cover plate layer 102 including the plurality of grooves. The first cover plate layer 101 completely covers the plurality of grooves. Correspondingly, the plurality of protrusions 103 is formed on the side (that is, the first surface S1) of the first cover plate layer 101 in contact with the plurality of grooves. In this embodiment, the refractive index of the second cover plate layer 102 is equal to 1.5. The first cover plate layer 101 is made of a material having a low refractive index. The refractive index of the first cover plate layer 101 is less than 1.5.

Specifically, in this embodiment, a method for preparing the cover plate 10 includes the following. First, a raw material (having a thickness between 100 μm and 500 μm) of the second cover plate layer 102 is thinned, where a thickness after the thinning is generally between 30 μm and 70 μm. Then the surface on the side of the second cover plate layer 102 attached to the first cover plate layer 101 is patterned by using a yellow light process or a laser process, to form a plurality of grooves respectively corresponding to the plurality of protrusions 103, where a cross-sectional width of each of the grooves is between 10 μm and 30 μm. Next, a strengthening process is performed to improve a surface strength and a bending property of the second cover plate layer 102. Finally, a material having a low refractive index (the first cover plate layer 101) is prepared on the surface on the side of the second cover plate layer 102 including the grooves, to obtain the cover plate 10. During module attachment of the cover plate 10, the side of the first cover plate layer 101 away from the second cover plate layer 102 is attached to the light exit side of the OLED display panel.

It can be understood that, the grooves formed on the surface of the second cover plate layer 102 are required to be recessed toward the light exit side of the OLED display panel, to achieve convergence of the light, that is, the side of the second cover plate layer 102 including the grooves needs to be disposed near the light exit side of the OLED display panel. Thus, when the light emitted from the organic light emitting layer of the OLED display panel passes through the plurality of grooves, the plurality of grooves can function as a microlens array to converge the light. In this way, the light exiting efficiency of the cover plate 10 is enhanced, that is, the light exiting efficiency of the display device is enhanced.

In addition, the light emitted from the organic light emitting layer of the OLED display panel passes through the first cover plate layer 101 and then the second cover plate layer 102. Since the first cover plate layer 101 is made of the material having a low refractive index, a propagation direction of the light emitted from the organic light emitting layer is not affected.

In an embodiment, the material having a low refractive index includes alumina ($Al_2O_3$) or silicon dioxide ($SiO_2$).

Figure 2:
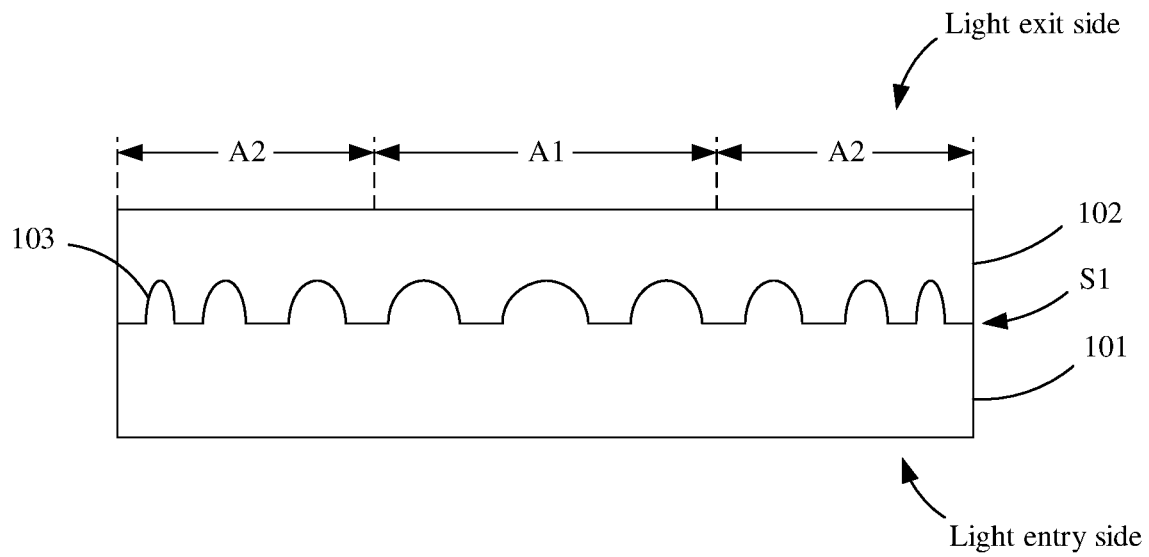
FIG. 2 is a basic schematic structural diagram of another cover plate according to an embodiment of this application.

FIG. 2 is a basic schematic structural diagram of another cover plate according to an embodiment of this application. A cover plate 10 includes a first cover plate layer 101 and a second cover plate layer 102. The first cover plate layer 101 is located on a light entry side of the cover plate 10. The second cover plate layer 102 is located on a light exit side of the cover plate 10 and attached to a first surface S1 of the first cover plate layer 101. A plurality of protrusions 103 are disposed on the first surface S1 of the first cover plate layer 101. A refractive index of the first cover plate layer 101 is less than a refractive index of the second cover plate layer 102. A cross-sectional width of each of the protrusions 103 is greater than or equal to 10 μm and less than or equal to 30 μm. The cover plate 10 includes a bending area A1 and a non-bending area A2. The cross-sectional width of the protrusion 103 located in the bending area A1 is greater than the cross-sectional width of the protrusion 103 located in the non-bending area A2.

It can be understood that, during bending of the cover plate 10, an inner side of the first cover plate layer 101 in the bending area A1 is squeezed, and an outer side is stretched, that is, the protrusions 103 in the bending area A1 are stretched. In this application, the cross-sectional width of the each protrusion 103 in the bending area A1 is set to be greater than the cross-sectional width of the each protrusion 103 in the non-bending area A2. In this way, during the bending, most of a stretching stress may be transferred from the protrusions 103 in the bending area A1 to the second cover plate layer 102. Therefore, during the bending, the cover plate 10 is not greatly deformed as a result of an excessively large bending force, and cracking is avoided. Specifically, the cross-sectional widths of the protrusions 103 decrement from the bending area A1 to the non-bending area A2, so that a bending stress for bending the cover plate 10 can be further balanced, thereby avoiding cracking during the bending.

Figure 3:
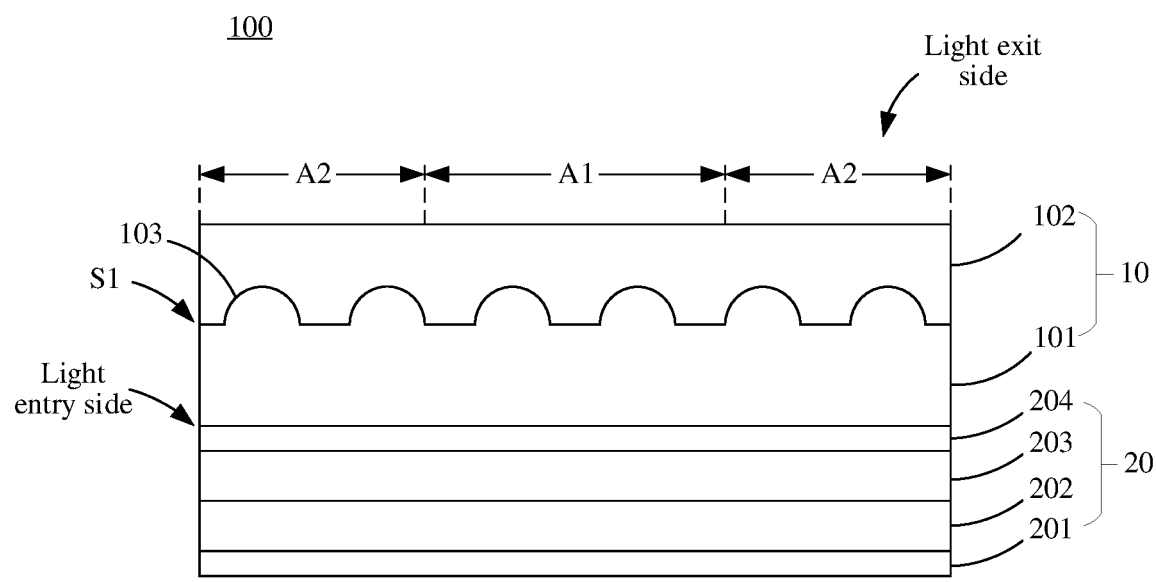
FIG. 3 is a basic schematic structural diagram of a display device according to an embodiment of this application.

FIG. 3 is a basic schematic structural diagram of a display device according to an embodiment of this application. A display device 100 includes a flexible display panel 20 and a cover plate 10 disposed on the flexible display panel 20. For a structure of the cover plate 10 and a method for preparing the same, refer to related descriptions of FIG. 1 and FIG. 2. Details are not described herein again. The flexible display panel 20 can be an OLED display panel. Specifically, the flexible display panel 20 includes a flexible substrate 201, a driving circuit layer 202 disposed on the flexible substrate 201, a light emitting function layer 203 disposed on the driving circuit layer 202, and a film packaging layer 204 disposed on the light emitting function layer 203. The cover plate 10 is disposed on a side of the film packaging layer 204 away from the light emitting function layer 203, and the light emitting function layer 203 includes an organic light emitting layer (not shown in the figure).

It can be understood that, according to this embodiment of this application, a plurality of protrusions 103 are disposed on the first surface S1 of the first cover plate layer 101, the second cover plate layer 102 is attached to the first surface S1 of the first cover plate layer 101, and the refractive index of the first cover plate layer 101 is less than the refractive index of the second cover plate layer 102, so that light emitted by an organic light emitting layer of the flexible display panel 20 is transmitted from a film layer having a low refractive index (that is, the first cover plate layer 101, and is an optically thinner medium) to a film layer having a high refractive index (that is, the second cover plate layer 102, and is an optically denser medium), thereby reducing light loss caused by total reflection. The disposed plurality of protrusions 103 forms a microlens array for converging the light at the light exit side of the cover plate 10, so that light exiting efficiency of the whole display device 100 is increased.

The display device 100 provided in this embodiment of this application can be any product or component having a display function, such as a mobile phone, a notebook computer, a digital camera, or a navigator.

In conclusion, the cover plate provided in this embodiment of this application includes a first cover plate layer and a second cover plate layer. The first cover plate layer is located on a light entry side of the cover plate. The second cover plate layer is located on a light exit side of the cover plate and attached to a first surface of the first cover plate layer. A plurality of protrusions are disposed on the first surface of the first cover plate layer. A refractive index of the first cover plate layer is less than a refractive index of the second cover plate layer. According to this application, a plurality of protrusions are disposed on the first surface of the first cover plate layer, the second cover plate layer is attached to the first surface of the first cover plate layer, and the refractive index of the first cover plate layer is less than the refractive index of the second cover plate layer, so that light emitted by an organic light emitting layer of an OLED display panel is transmitted from a film layer having a low refractive index to a film layer having a high refractive index, thereby reducing light loss caused by total reflection. The disposed plurality of protrusions forms a microlens array for converging the light at the light exit side of the cover plate, so that light exiting efficiency of the whole display device is increased, resolving the technical problem as follows: since the cover plate in the related art uses glass having a refractive index less than the refractive index of the organic light emitting layer, according to a principle of total reflection, most of the light emitted from the organic light emitting layer returns to the organic light emitting layer, resulting in low light exiting efficiency of the display device.

In the foregoing embodiments, description of each embodiment focuses on a different part, and for parts that are not described in detail in one embodiment, reference may be made to the related description of other embodiments.

It may be understood that, a person skilled in the art can make equivalent replacement or changes according to the technical solutions and the inventive concepts of the present invention, and all such replacements or changes shall fall within the protection scope of the appended claims of this application.

What is claimed is:

1. A cover plate, comprising:
a first cover plate layer, located on a light entry side of the cover plate; and
a second cover plate layer, located on a light exit side of the cover plate and attached to a first surface of the first cover plate layer, wherein
a plurality of protrusions is disposed on the first surface of the first cover plate layer, and a refractive index of the first cover plate layer is less than a refractive index of the second cover plate layer;
wherein the cover plate comprises a bending area and a non-bending area, and a cross-sectional width of the protrusion located in the bending area is greater than a cross-sectional width of the protrusion located in the non-bending area.

2. The cover plate according to claim 1, wherein the cross-sectional widths of the protrusions decrement from the bending area to the non-bending area.

3. The cover plate according to claim 1, wherein a thickness of the first cover plate layer or the second cover plate layer is greater than or equal to 30 μm and less than or equal to 70 μm.

4. The cover plate according to claim 3, wherein a height of each of the protrusions is greater than or equal to one third of the thickness of the second cover plate layer and less than or equal to two thirds of the thickness of the second cover plate layer.

5. The cover plate according to claim 1, wherein a cross-sectional shape of each of the protrusions is semicircular, semielliptical, triangular, or rectangular.

6. The cover plate according to claim 1, wherein the first cover plate layer comprises ultra-thin glass, and the second cover plate layer comprises one of titanium dioxide, tantalum pentoxide, or hafnium oxide.

7. The cover plate according to claim 1, wherein the second cover plate layer is made of transparent polyimide, and the first cover plate layer is made of alumina oxide or silicon dioxide.

8. The cover plate according to claim 1, wherein the refractive index of the second cover plate layer is greater than or equal to 1.5.

9. The cover plate according to claim 1, wherein a cross-sectional width of each of the protrusions is greater than or equal to 10 μm and less than or equal to 30 μm.

10. A display device, comprising: a flexible display panel and a cover plate disposed on the flexible display panel, wherein the cover plate comprises:
   a first cover plate layer, located on a light entry side of the cover plate; and
   a second cover plate layer, located on a light exit side of the cover plate and attached to a first surface of the first cover plate layer, wherein
   a plurality of protrusions is disposed on the first surface of the first cover plate layer, and a refractive index of the first cover plate layer is less than a refractive index of the second cover plate layer;
   wherein the cover plate comprises a bending area and a non-bending area, and a cross-sectional width of the protrusion located in the bending area is greater than a cross-sectional width of the protrusion located in the non-bending area.

11. The display device according to claim 10, wherein the cross-sectional widths of the protrusions decrement from the bending area to the non-bending area.

12. The display device according to claim 10, wherein a thickness of the first cover plate layer or the second cover plate layer is greater than or equal to 30 μm and less than or equal to 70 μm.

13. The display device according to claim 12, wherein a height of each of the protrusions is greater than or equal to one third of the thickness of the second cover plate layer and less than or equal to two thirds of the thickness of the second cover plate layer.

14. The display device according to claim 10, wherein a cross-sectional shape of one of the protrusions is semicircular, semielliptical, triangular, or rectangular.

15. The display device according to claim 10, wherein the first cover plate layer is made of ultra-thin glass, and the second cover plate layer is made of one of titanium dioxide, tantalum pentoxide, or hafnium oxide.

16. The display device according to claim 10, wherein the second cover plate layer is made of transparent polyimide, and the first cover plate layer is made of alumina oxide or silicon dioxide.

17. The display device according to claim 10, wherein the refractive index of the second cover plate layer is greater than or equal to 1.5.

18. The display device according to claim 10, wherein a cross-sectional width of each of the protrusions is greater than or equal to 10 μm and less than or equal to 30 μm.

* * * * *